(12) United States Patent
Wada

(10) Patent No.: US 6,529,539 B1
(45) Date of Patent: Mar. 4, 2003

(54) MOLECULAR LIGHT EMISSION DEVICE

(75) Inventor: Yasuo Wada, Bunkyo-ku (JP)

(73) Assignee: Hitachi, Ltd., Tokyo (JP)

(\*) Notice: Subject to any disclaimer, the term of this patent is extended or adjusted under 35 U.S.C. 154(b) by 0 days.

(21) Appl. No.: 09/267,619

(22) Filed: Mar. 15, 1999

(30) Foreign Application Priority Data

Mar. 17, 1998 (JP) ............................................. 10-066500

(51) Int. Cl.⁷ .............................................. H01S 3/097
(52) U.S. Cl. ............................. 372/89; 372/86; 372/87; 372/56; 372/76
(58) Field of Search ............................... 372/89, 86–87, 372/76, 56; 313/498, 499, 501; 428/690, 917

(56) References Cited

U.S. PATENT DOCUMENTS

| | | | |
|---|---|---|---|
| 5,554,911 A | * 9/1996 | Nakayama et al. | ......... 313/503 |
| 5,932,895 A | * 8/1999 | Shen et al. | ................. 257/103 |
| 5,969,475 A | * 10/1999 | Friend et al. | ................ 313/498 |
| 6,060,826 A | * 5/2000 | Ueda et al. | .................. 313/498 |
| 6,330,262 B1 | * 12/2001 | Burrows et al. | .............. 372/39 |

OTHER PUBLICATIONS

"An Overview of Organic Electroluminescent Device", Bulletin of the Japanese Society of Printing Science and Technology, vol. 34, No. 4, 1997, Y. Shirota, pp. 218–226.

"Achieving Full–Color Organic Light–Emitting Devices for Lightweight Flat–Panel Displays", IEEE Transactions on Electron Devices, vol. 44, No. 8, 1997, P. E. Burrows et al, pp. 1188–1203.

Oyo–butsuri, vol. 66, No. 2, 1997, pp. 109–116.

\* cited by examiner

Primary Examiner—Paul Ip
Assistant Examiner—Delma R. Flores Ruiz

(57) ABSTRACT

Injection efficiency is greatly improved by chemically bonding an organic light emission molecule to an electrode, so as to realize a high efficiency light emission type of flat panel display and a high efficiency laser device, and realize a light emission type of flat panel display and a laser device which have higher performance than conventional organic light emission molecular devices.

16 Claims, 11 Drawing Sheets

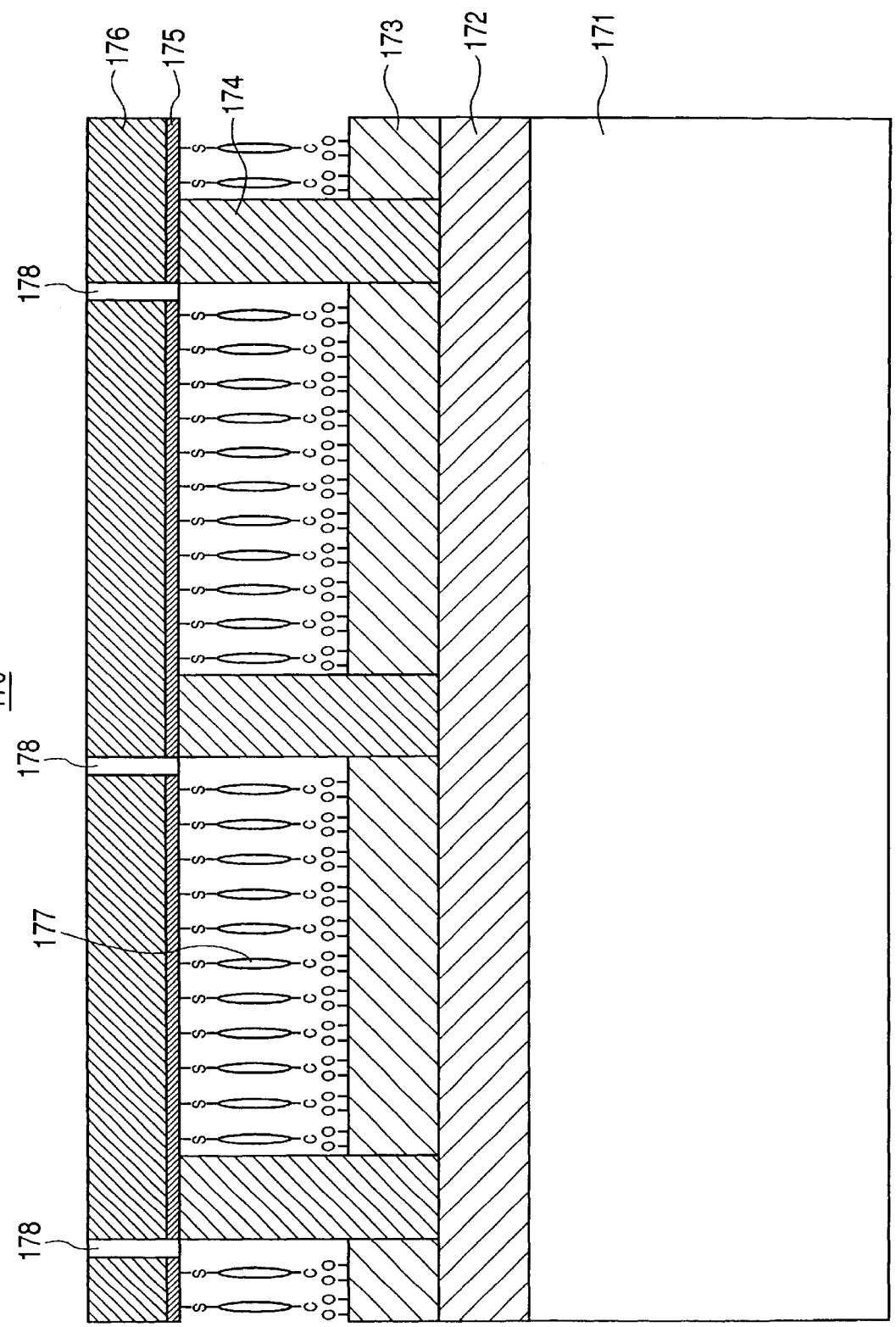

MOLECULAR LIGHT EMISSION DEVICE

BACKGROUND OF THE INVENTION

The present invention relates to a new structure of a light emission device used for, e.g., a display device, and specifically to a molecular light emission device at least comprising an electrode for injecting electrons, an electrode for injection holes, and an organic molecule emitting light by electric current injection, wherein an organic molecular layer formed between the electrodes consists essentially of a single (i.e.,monolayer) molecule. In a variation of the present invention, the function of the interior of the organic molecule emitting light by the electric current injection may be divided into the following: functions of an electron transport layer, a light emission layer, a hole transport layer and the like, but the present invention relates to a molecular emission device characterized in that the molecule itself consists essentially of a single (i.e., monolayer) molecule.

In conventional stack-type molecular light emission device comprising organic molecules (referred to as stack-type organic light emission devices, or stack devices, hereinafter), conjugate molecules composed mainly of aromatic groups are deposited, as an electron transport layer, a light emission layer and a hole transport layer, in this order from the side of an electron injection electrode and to each thickness of several tens of nanometers, and finally a hole injection electrode is formed. (The outline of the structure thereof is in detail described in, for example, Bulletin of the Japanese Society of Printing Science and Technology, Vol. 34, No. 4 (1997), pp. 218–226). Electrons and holes are respectively injected from both of the electrode, i.e., the electron injection electrode and the hole injection electrode, and then recombined in the light emission layer to emit light. The details of organic light emission devices having conventional structures are described in IEEE Trans. Electron Devices, Vol. 44 No. 8 (1997), and pp. 1188–1203 and the like.

If it is possible to put into practical use a display device having excellent characteristics such as thinness, light emitting ability, flatness and flexibility as the stack-type molecular light emission devices exhibit, a new industrial field can be realized as a high-performance display device instead of a liquid crystal display device. Such a device has been much expected.

However, such stack-type organic light emission devices having a conventional structure have various problems from the viewpoint of practicability even at the present time, when 30 years have passed since the discovery of the phenomenon concerned with the devices. Thus, the devices are far from practicability. Current problems of the stack-type organic light emission devices will be described in the following items.

(1) The contact resistance between the injection electrodes and the molecules is so large that the efficiency of injecting electrons or holes is low. In other words, ohmic contact cannot be realized.

(2) Since the mechanism of electric conduction between molecules is based on tunnel conduction or hopping conduction, conduction efficiency is very low. Thus, injected carries are recombined on their way, so that they do not necessarily contribute to light emission.

(3) The probability is low that the carries reaching the center of light emission excite molecules which contribute to the light emission. Thus, light emission efficiency does not become high.

(4) Light emitted from excited molecules is absorbed or reflected on its way, so that the probability that the light is not emitted outwards from the device is high. Thus, overall light emission efficiency is low.

According to Tsutsui(Oyo-butsuri, Vol. 66, No. 2, 1997, pp. 109–116), theoretical light emission efficiency of stack devices is 5%. Since practical efficiency is considered to be far lower than the theoretical efficiency, the practical efficiency is remarkably lower than that of current light emission devices, such as 25% of a fluorescent light lamp. Thus, stack devices of a present situation are far from practicability.

SUMMARY OF THE INVENTION

In order to solve such problems of conventional light emission devices comprising an organic molecule, the present invention has been made and provides means for solving the problems in the above-mentioned four items at once. That is, the present invention has the following characteristics.

(1) Contact resistance between an injection electrode and a molecule layer is made small so that the injection efficiency of electrons and holes into the molecules becomes very high.

(2) The conduction mechanism of the molecule layer is made ohmic to raise conductive efficiency.

(3) Almost 100% of carries that reach the center of light emission would contribute to light emission.

(4) Light emitted from excited molecules goes outwards at a high probability.

For this, the present invention provides a device having a structure wherein a single light emission molecule is chemically bonded directly to an electron injection electrode and a hole injection electrode, which is quiet different from the stack-type device using layers of molecules, such as an electron transport layer, a light emission layer and a hole transport layer, each made up of different properties. This single light emission molecule may have electron transport, electron-hole recombination (ie. light emission), hole transport and the like functions. Namely, in order to realize the high efficiency organic light emission device, it is sufficient that a single molecule having at least light emission function is connected to each surface of two electrodes through chemical bonds.

Such a structure is referred to as a single organic molecular light emission device or a single device, hereinafter.

The following will describe the reasons why the single molecule is connected to the two electrodes through chemical bonds so that a single organic molecular light emission device having a high light emission efficiency can be realized.

(1) The reason why the contact resistance between a carrier injection electrode and a molecule is high in conventional stack-type devices is that any chemical bond between the electrode and the molecule cannot be produced. Since in stack-type devices a molecule layer is in general formed on its electrode in air or low vacuum, an oxide layer on the surface of the electrode, contamination from the surroundings, and the like are produced between the electrode and the molecule layer. This results in a large resistance. Furthermore, the molecule structure used in conventional stack-type devices has a substituent which cannot be chemically bonded to the electrode. Accordingly, if a chemical bond can be produced between the electrode and the light emission molecule, contact resistance can be made sufficiently low. In the single device according to the present invention, a chemical bond can be produced between the electrode and the light emission molecule. Thus, its contact resistance can be made sufficiently low.

(2) The reason why conduction efficiency in a molecule layer in stack-type devices is low is that respective molecules are electrically isolated and that they are not chemically bonded to each other. Therefore, if both electrodes are connected through a single molecule, a high conductivity in the light emission layer sufficient for practicability can be ensured because of a satisfactorily high conductive efficiency in the single molecule.

(3) The reason why excited molecules are inactivated through a non-light emission process is considered to be based mainly on emission of phonons. It is well known to the public that there is a great probability that excited molecules are inactivated through a phonon transition process by interaction between molecules in stack-type devices. On the other hand, it is predicted that in the single device the process in which the excited state of molecules is deactivated to the ground state thereof arises at a probability determinable by the a probability process. Thus, this probability can be a physical and chemical maximum value. Therefore, the single device structure is also preferred from the standpoint of this aspect.

(4) In stack-type devices, light emitted from excited molecules is again absorbed into adjacent molecule, so that light emission efficiency is reduced. On the other hand, it is considered that in the single device its emitted wavelength is longer than its absorbable wavelength. Thus, it is expected that a decrease in light emission efficiency by such absorption is reduced.

As describe above, the single device structure can overcome the basic problem of low efficiency in conventional stack-type devices. Thus, the single device structure is a technical means useful for putting an organic light emission device to practical use. Moreover, because of high efficiency the single device structure can make electric field strength sufficiently low so as so that this device structure which is also practicable from the standpoint of reliability.

BRIEF DESCRIPTION OF THE DRAWINGS

FIG. 14 is a cross section illustrating a specific structure of a light emission type of display according to an embodiment of the present invention.

DESCRIPTION OF THE PREFERRED EMBODIMENT

Figure 1:
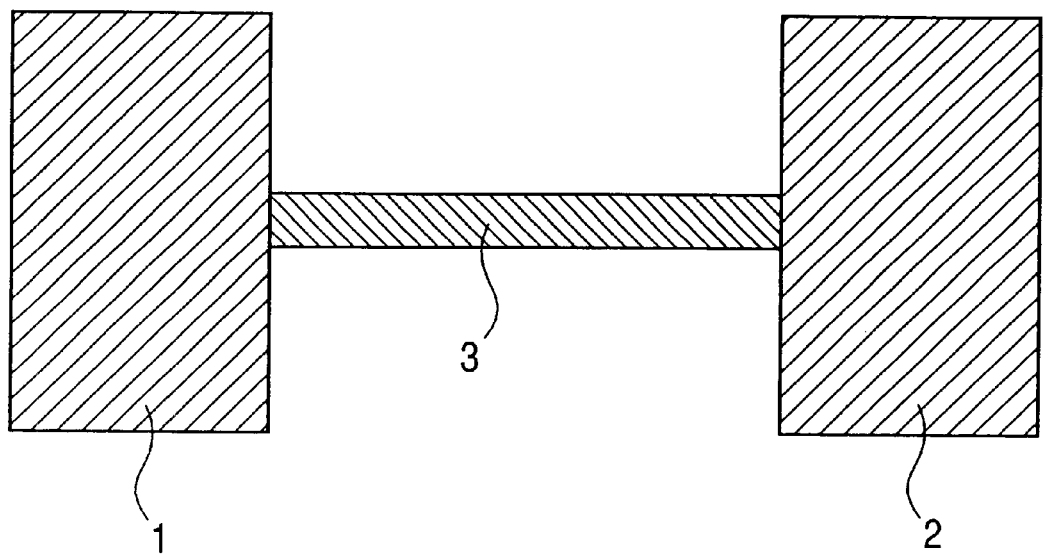
FIG. 1 is a schematic view illustrating a basic structure of a light emission device of a single device structure according to the present invention.

FIG. 1 is a schematic view of a basic structure of a light emission device of a single device structure according to the present invention, and illustrates a structure wherein a conductive light emission molecule 3 is arranged between an electron injection electrode 1 and a hole injection electrode 2. The connection between the molecule and the electrodes becomes non-ohmic contact in the same way as in conventional stack devices if they merely contact each other. Thus, the injection of electrons or holes from the electrode becomes low-efficiency injection such as tunnel injection, so that light emission efficiency cannot be high. However, if a combination such as gold and thiol, or silicon and carbonic acid is used, a chemical bond can be formed between each of the electrodes and the molecule so that a sufficiently low contact resistance can be realized.

It is well known that combinations of an element which provide a chemical bond between an electrode and a substituent of amolecule include various kinds, for example, selenium or tellurium, and gold or silver. Therefore, if a light emission molecule having, at its both end, such functional groups are used, a high-efficiency carrier injection can be realized so that light emission efficiency can be high.

Figure 2:
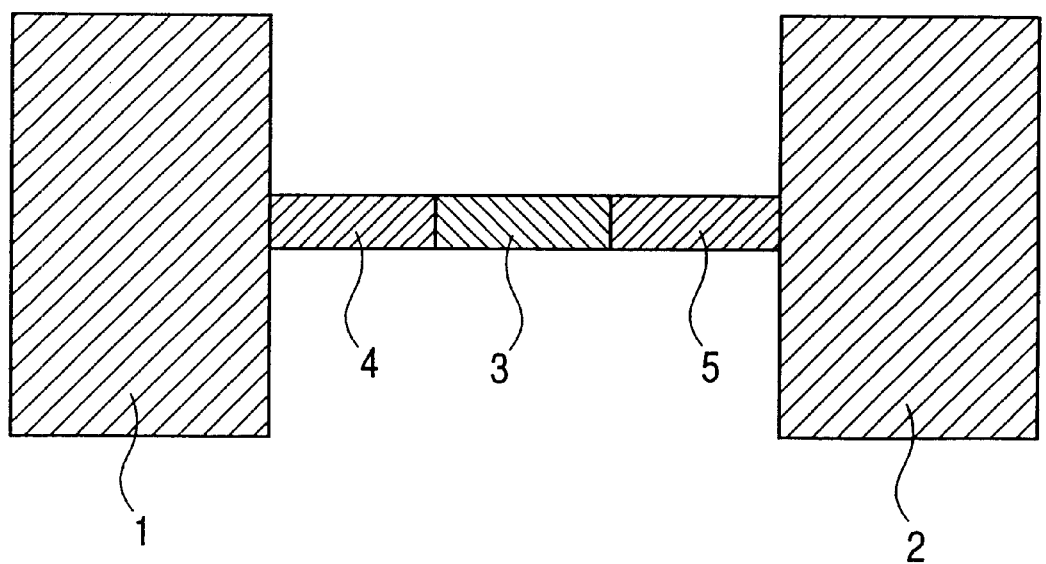
FIG. 2 is a schematic view illustrating a structure wherein the basic structure, shown in FIG. 1, of the light emission device of the single device structure according to the present invention is changed into a more effective form.
Figure 3A:
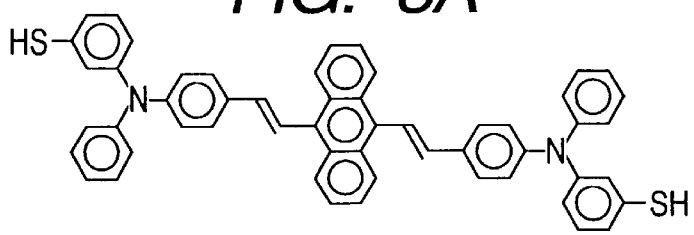
FIGS. 3A–3E show structure examples of a single molecule which can be adopted as a light emission molecule according to the present invention.
Figure 3B:
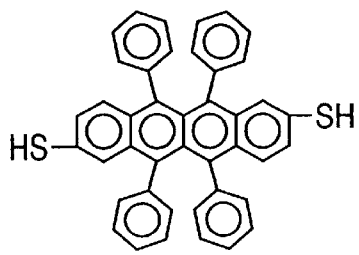
Figure 3C:
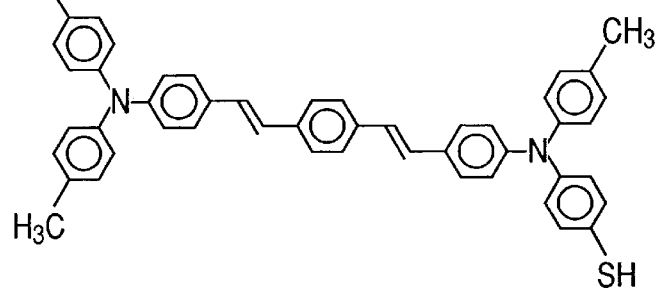
Figure 3D:
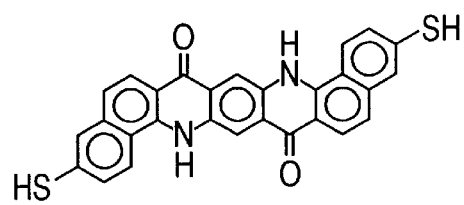
Figure 3E:
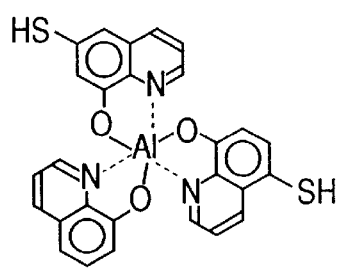
Figure 4A:
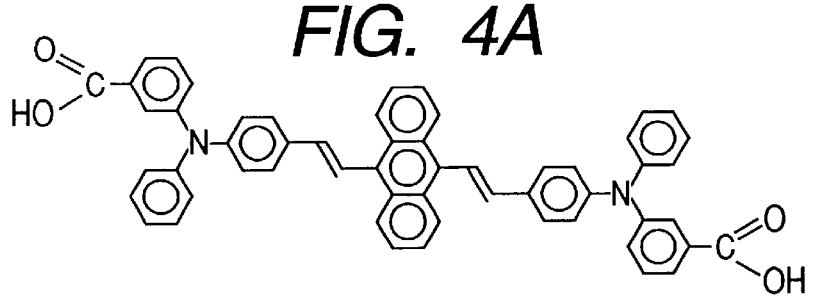
FIGS. 4A–4E show other structure examples of a single molecule which can be adopted as a light emission molecule according to the present invention.
Figure 4B:
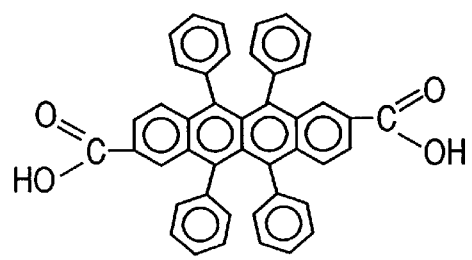
Figure 4C:
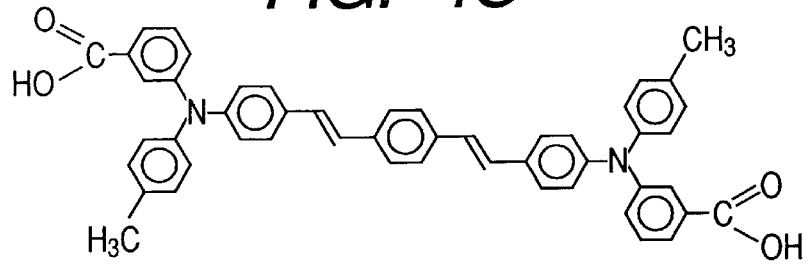
Figure 4D:
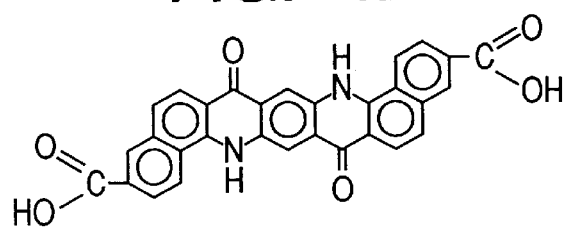
Figure 4E:
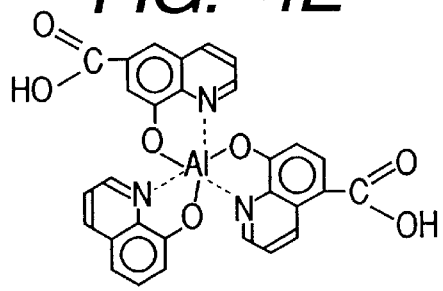
Figure 5A:
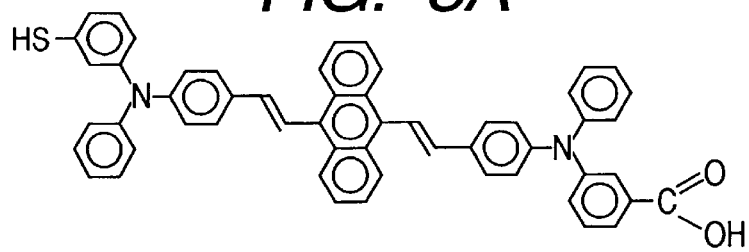
FIGS. 5A–5E show structure other examples of a single molecule which can be adopted as a light emission molecule according to the present invention.
Figure 5B:
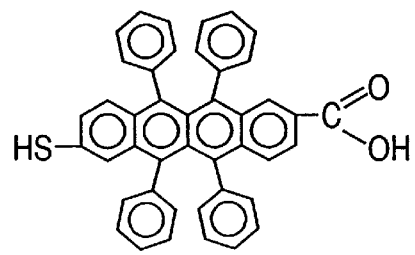
Figure 5C:
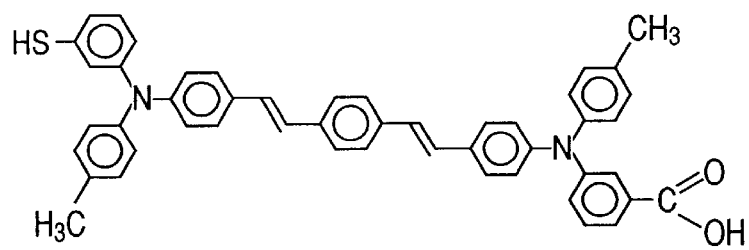
Figure 5D:
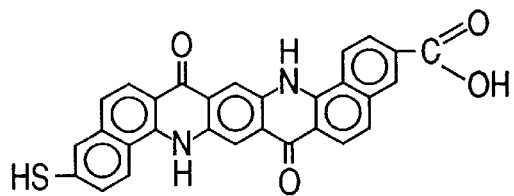
Figure 5E:
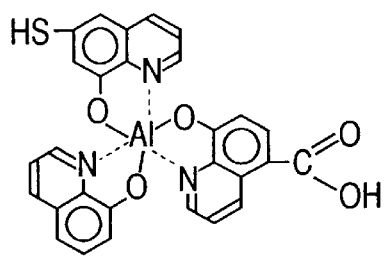
Figure 6A:
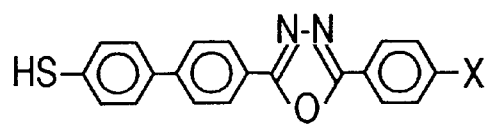
FIGS. 6A–6D show structure examples of a single molecule for improving electron injection ability of a light emission molecule.
Figure 6B:
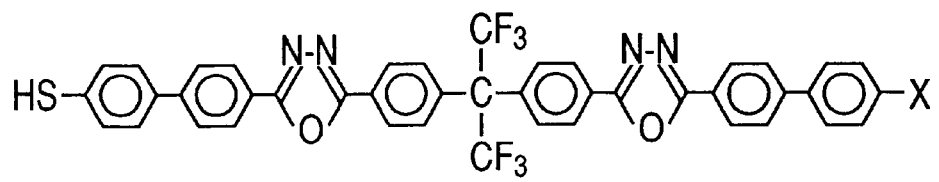
Figure 6C:
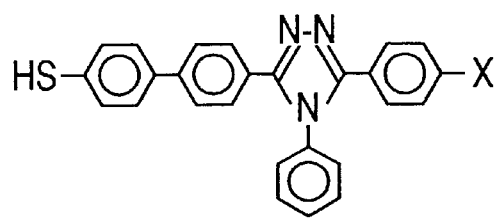
Figure 6D:
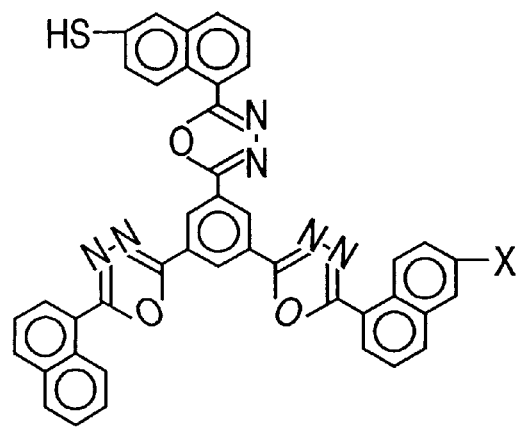
Figure 7A:
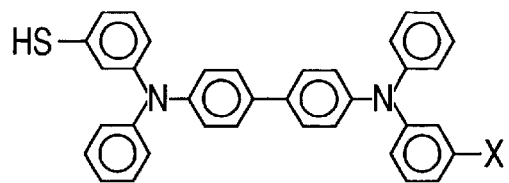
FIGS. 7A–7D show structure examples of a single molecule for improving hole injection ability of a light emission molecule.
Figure 7B:
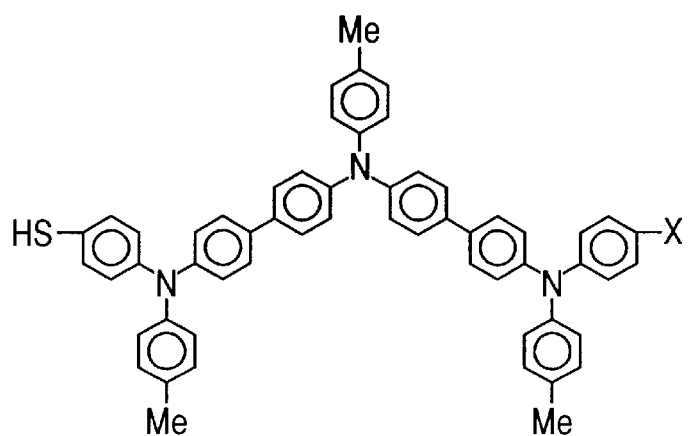
Figure 7C:
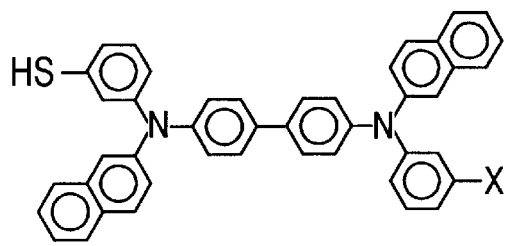
Figure 7D:
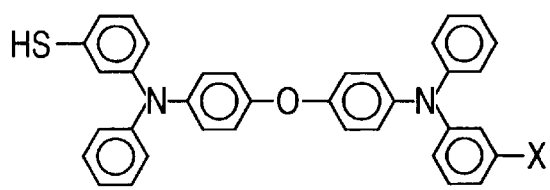

Moreover, concerning the structure illustrated in FIG. 1, its moiety of the conductive light emission molecule 3 can be changed into a more effective form. FIG. 2 schematically illustrates a structure wherein the basic structure of the light emission device having the single device structure according to the present invention, illustrated in FIG. 1, is changed into a more effective form, and is a schematic view illustrating a case that at the time of arranging the conductive light emission molecule 3 between the electron injection electrode 1 and the hole injection electrode 2 an electron conduction molecule 4 is formed between the electron injection electrode 1 and the conductive light emission molecule 3 and further a hole conduction molecule 5 is formed between the hole injection electrode 2 and the conductive light emission molecule 3. By such a composite structure, light emission efficiency can be made higher than that of the structure illustrated in FIG. 1. This reason is as follows. Since in the structure illustrated in FIG. 1 the conductive light emission molecule 3 is chemically bonded to the injection electrodes 1 and 2, this fact has an influence on the molecular orbit of the conductive light emission molecule 3 so that an actual value may be shifted from the value that is initially set for the independent molecule. As illustrated in FIG. 2, the electron conduction molecule 4 and the hole conduction molecule 5 are inserted between the electron injection electrode 1 and the light emission molecule 3 and between the hole injection electrode 2 and the light emission molecule 3, respectively, so that an effect by such an interaction can also be reduced.

Of course, even direct contact also makes it possible to exhibit a desired performance sufficiently by molecule design for which such an interaction is considered from the start. Combination of the light emission molecule 3, the electron conduction molecule 4 and the hole conduction molecule 5 may be selected appropriately. For example, the moiety of the light emission body may be made of the electron injection electrode 1, the electron conduction molecule 4, the light emission molecule 3 and the hole injection electrode 2 that are arranged in this order. Of course, by changing the order, a structure may be adopted wherein the electron injection electrode 1, the light emission molecule 3, the hole conduction molecule 5 and the hole injection electrode 2 are arranged in this order. Design of a suitable molecule structure, corresponding to each device structure, makes it possible to realize a single organic molecular light emission device having a high light emission efficiency.

As described above, according to the present invention a high-performance light emission device having a higher efficiency than that of conventional devices can be realized, and thus industrial worth of the present invention is high.

Embodiment I

First, disclosed is an example of a single molecule having light emission ability by itself, which is necessary for realizing a single device structure. Each of molecular structures shown in FIGS. 3A–3E is an example thereof. FIGS. 3A, 3B, 3C, 3D and 3E show derivatives of BSA, Rubrene, DSB, QN-2 and Alq, respectively. The body of light emission molecules generally has a structure of an aromatic ring as a basis. Of course, if molecules have a high light emission ability, that is, a high electricity-light converting efficiency, the molecules are allowable as light emission molecules. Namely, the light emission molecules are not limited to examples shown in FIG. 3. Thiol groups at both ends of each of the molecules are chemically bonded to gold that is used as a current injection electrode, so that the injection efficiency of carries from the electrode to the molecule becomes high. The sulfur atoms of the thiol groups may be replaced by selenium, tellurium or the like. Namely, the atom of selenium, tellurium or the like is also chemically bonded to gold so as to form a good electrode-molecule junction. Of course, as is clear from the subject matter of the present invention, the organic molecule having a light emission ability is not limited to examples shown in FIG. 3. Compounds that have in their molecule a conjugate bond such as an aromatic ring and have light emission ability are generally included within the scope of the present invention.

FIG. 4 illustrates other examples of a single molecule having light emission ability by itself. Molecule structures shown in FIGS. 4A–4E are examples similar to ones shown in FIG. 3. That is, FIGS. 4A, 4B, 4C, 4D and 4E show derivatives of BSA, Rubrene, DSB, QN-2 and Alq, respectively. The difference from examples shown in FIG. 3 is in that the junction between the molecule and the electrode in the single device structure shown in FIG. 3 is realized through carbonic acid. Carbonic acid is selectively bonded to silicon, so that the free discretion of selecting an electrode material is enlarged.

In each of FIGS. 5A–5E, a single molecule necessary for realizing a single device structure is substantially the same as each example shown in FIGS. 3 and 4. However, one substituent thereof is a thiol, and the other is a carbonic acid. This makes it possible that molecule arrangement is selectively decided. In other words, if the electron injection electrode and the hole injection electrode are made of, for example, gold and silicon, respectively, and the molecule disclosed in FIG. 5 is bonded thereto, the molecular end at the thiol side and that at the carbonic acid side are necessarily bonded to gold and silicon, respectively. Thus, even if the structure of the light emission molecule is asymmetrical, it is certainly possible to form a given single device structure of the electron injection electrode/light emission molecule/hole injection electrode.

In the present invention, the structure of the body of the light emission molecule is not necessarily limited to ones disclosed in the present embodiment. If light emission molecules have reactive groups to be bonded to the electrodes at their both ends, they are included within the scope of the present invention. Use of a molecule having such a structure makes it possible to realize a single device.

Embodiment II

The present embodiment discloses a molecule structure which is connected to the light emission molecule and the electron injection electrode to make the improvement in electron injection ability possible.

FIGS. 6A–6D show examples of the molecule connected to the light emission molecule and the electron injection electrode. FIGS. 6A, 6B, 6C and 6D show derivatives of PBD, OXD-2, TAZ and OXD-4, respectively. Naturally, if molecules have a high electron conduction ability, the molecules are allowable. Namely, such molecules are not limited to examples shown in FIG. 6. For use as a molecule inserted between the light emission body and the electrode in a single device, it is important that the molecule moiety connected to the electrode has a substituent for the connection as shown in FIG. 6. Examples of the molecule to be connected to the light emission molecule demonstrate the cases wherein these substituents are thiols. If reactive groups can be selectively bonded to an electrode atom such as selenium, tellurium, or carbonic acid as described in EMBODIMENT I, they are included within the scope of the present invention. In FIG. 6, X represents a light emission molecule, and the other end of the light emission molecule X has the molecule and the substituent shown in EMBODIMENT III for the connection of the other end to a hole injection electrode.

Embodiment III

The present embodiment discloses a molecule structure which is connected to the light emission molecule and the hole injection electrode to make the improvement in hole injection ability possible.

FIGS. 7A–7D show examples of the molecule connected to the light emission molecule and the hole injection electrode. FIGS. 7A, 7B, 7C and 7D show derivatives of TPD, HITM1, NPB and HITM8, respectively. Naturally, if molecules have a high hole conduction ability, the molecules are allowable. Namely, such molecules are not limited to examples shown in FIG. 7. For use as a molecule inserted between the light emission body and the electrode in a single device, it is important that the molecule moiety connected to the electrode has a substituent for the connection as shown in FIG. 7. Examples of the molecule to be connected to the light emission molecule shown in FIG. 7 demonstrate the cases wherein these substituents are thiols. If reactive groups can be selectively bonded to an electrode atom such as selenium, tellurium, or carbonic acid as described in EMBODIMENT I, they are included within the scope of the present invention. In FIG. 7, X represents a light emission molecule, and the other end of the light emission molecule X has the molecule and the substituent shown in EMBODIMENT II for the connection of the other end to a hole injection electrode.

Embodiment IV

Figure 8A:
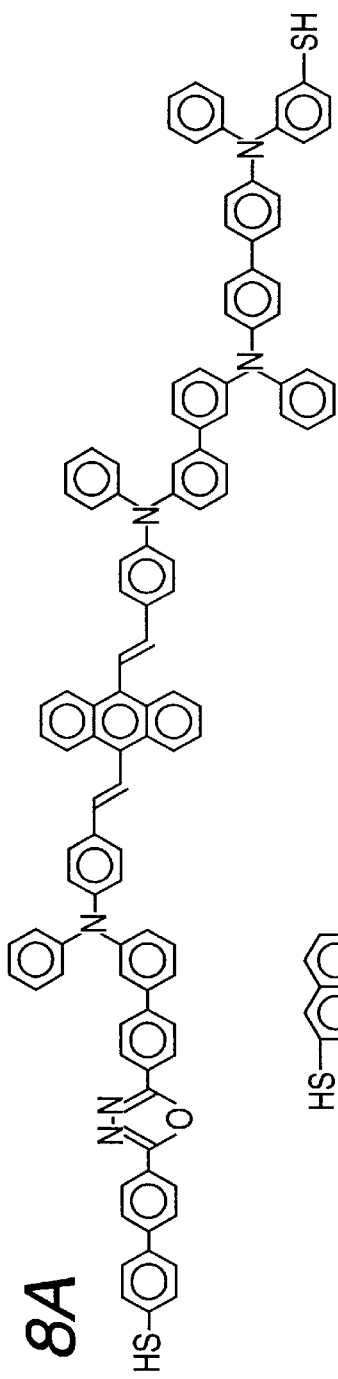
FIGS. 8A–8C show structure examples wherein a light emission molecule is combined with a single molecule for improving both of electron injection ability and hole injection ability.
Figure 8B:
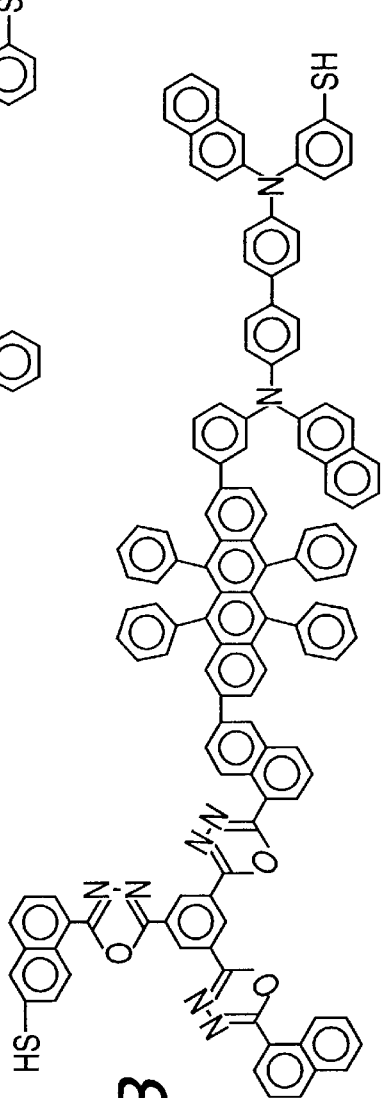
Figure 8C:
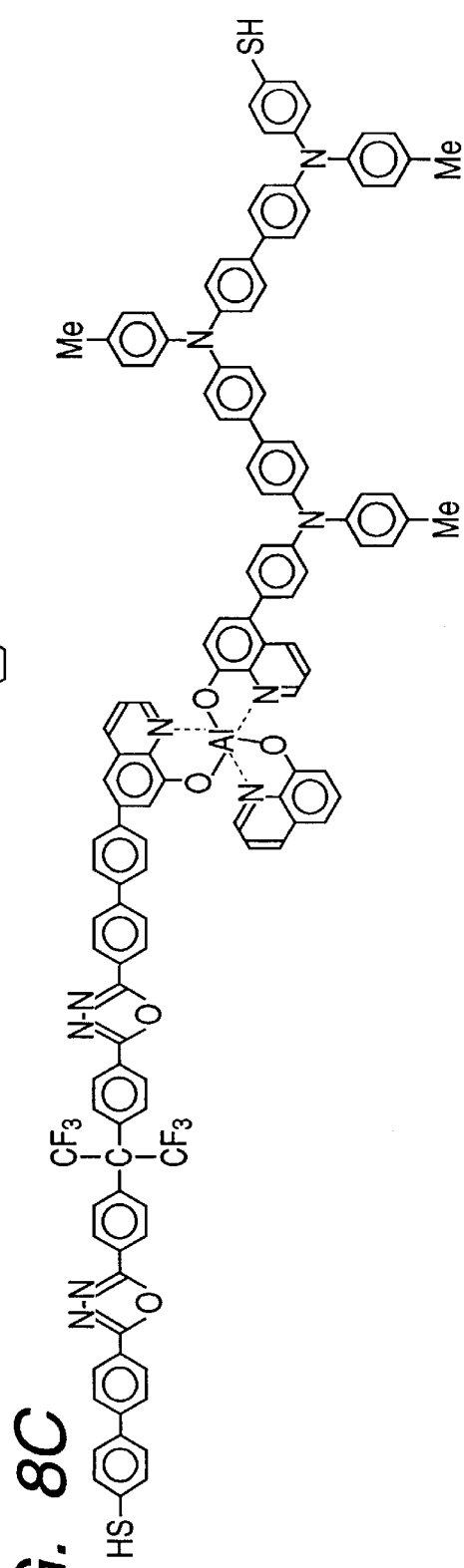

The present embodiment discloses examples of a high efficiency light emission molecule having both a molecule moiety which is connected to a light emission molecule and an electron injection electrode to make the improvement in electron injection ability possible, and a molecule moiety which is connected to the light emission molecule and the hole injection electrode to make the improvement in hole injection ability possible. The high efficiency light emission molecule that is inserted between the electron injection electrode and the hole injection electrode has the following three requirements: the capability of effectively carrying electrons and holes injected from the electrodes to the center of light emission; a high light emission ability for effective light emission at the center thereof; and reactive groups which are at both ends of the molecule and can be bonded to the electrodes. FIGS. 8A–8C show examples of the high efficiency light emission molecule that meets these requirements. FIGS. 8A, 8B, and 8C show derivatives of PBD-BSA-TPA, OXD-4-Rubrene-NPD, and PBD-Alq-HITM1, respectively.

Of course, the high efficiency light emission molecule and the molecule for the connection satisfying the requirements of the present invention are not limited to ones disclosed in the present embodiment, in the same manner as in EMBODIMENTS I–III. Namely, if molecules basically have a structure wherein molecules having electron conduction ability or hole conduction ability are at least connected to a light emission molecule or both sides of a light emission molecule, they are allowable.

Embodiment V

The light emission molecule inserted to the electron injection electrode 1 and the hole injection electrode 2 does not need to be only one molecule as schematically illustrated in FIGS. 1 and 2. Plural molecules may be arranged on substantially the same plane. In order to form such a structure, various means can be used. As schematically shown in, for example, FIG. 9, there may be used a structure obtained by depositing a gold thin layer 52 of several nanometer thickness on a flat transparent substrate 51, growing the light emission molecule 53 disclosed in the present invention as a monolayer by Langmuir-Blodgett method, growing gold 54 up to a thickness of several nanometers as an upper electrode, growing chromium 55 up to a thickness of several tens of nanometers, and at last growing aluminum 56 up to a thickness of 1 $\mu$m. Such a structure causes the gold 52 and the aluminum 56 to function as a lower electrode and the upper electrode, respectively, so as to emit light from the light emission molecule 53. Thus, amolecular light emission device can be formed.

Figure 9:
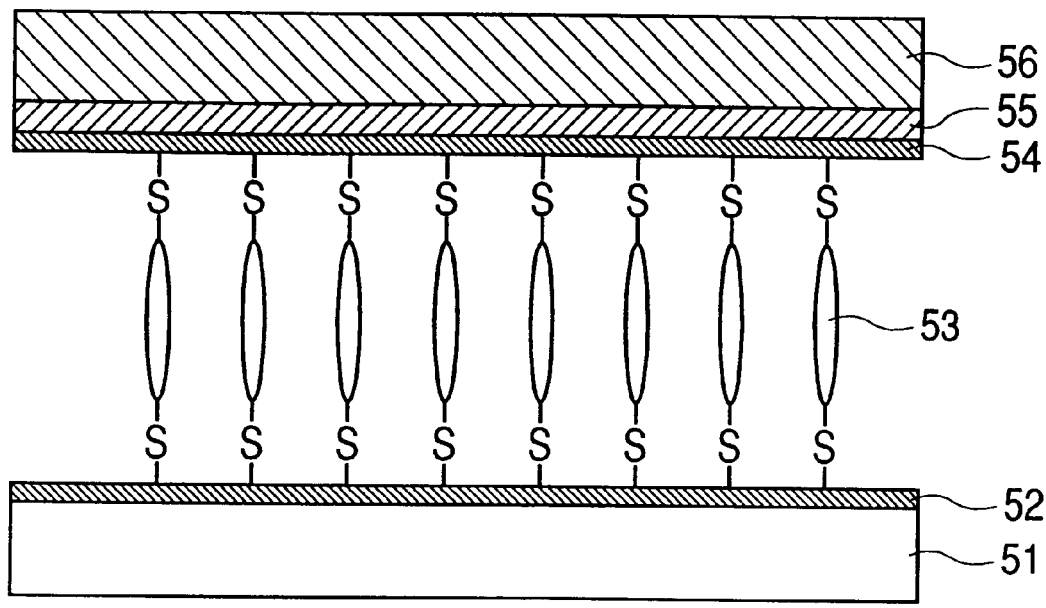
FIG. 9 is a cross section illustrating a basic structure of an embodiment of the present invention, as a light emission element wherein plural light emission molecules are arranged.
Figure 10:
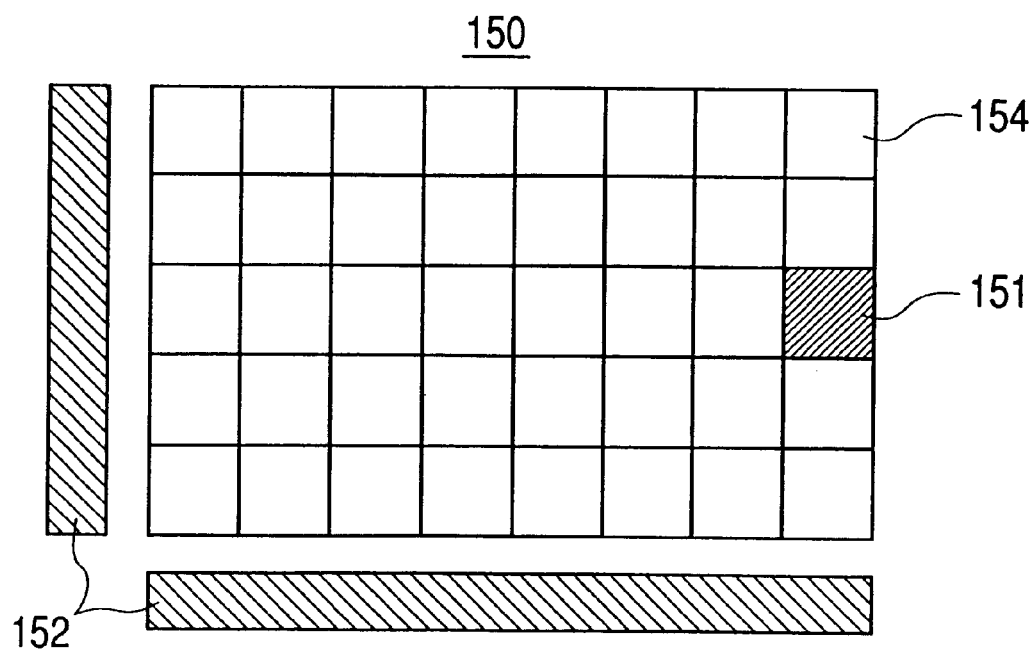
FIG. 10 is a plane view illustrating a light emission type of display according to an embodiment of the present invention, wherein the light emission elements illustrated in FIG. 9 are arranged in an XY matrix form.

It is possible to form a light emission type display having the light emission layer illustrated in FIG. 9 as a basic structure. FIG. 10 illustrates an example of a light emission type display 150 wherein unit-structures illustrated in FIG. 9 are arranged. In order that a given pixel 151 emits light, it is sufficient that drivers corresponding to such a matrix structure are formed as peripheral circuits 152. A high efficiency color light emission molecule display can be realized by a manner of varying molecules of respective pixels 154 correspondingly to emitting wavelengths or a manner of covering respective pixels with color filters. Since such a display can substantially completely satisfy various properties required for future displays, such as compactness, lightness, flexibility and high efficiency, it can give a sufficient impact onto engineering fields.

Figure 11:
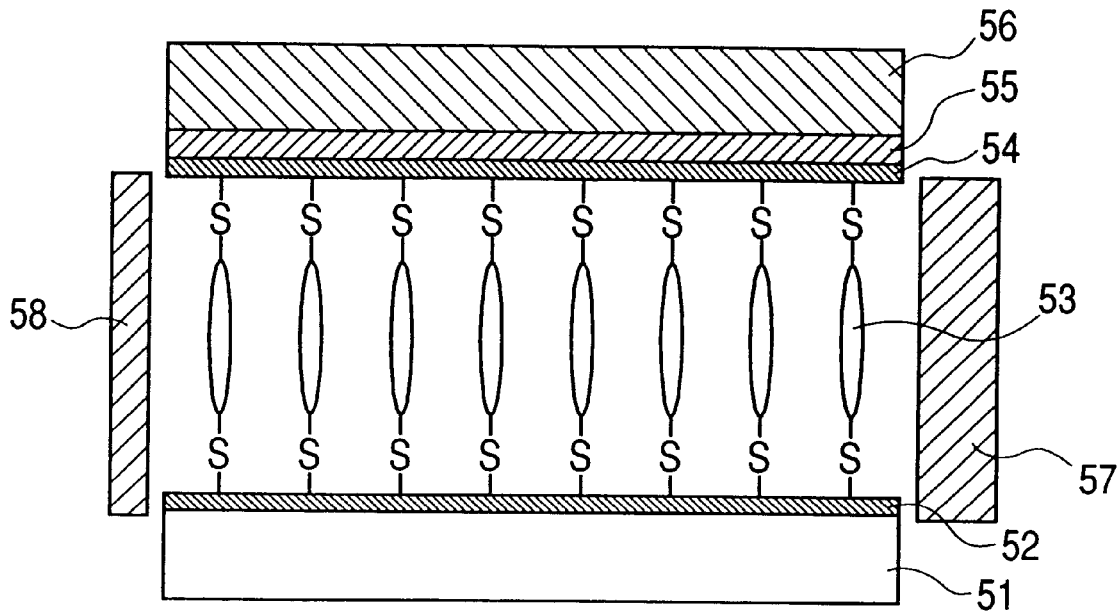
FIG. 11 is a cross section illustrating a Fabry-Perot type laser device according to an embodiment of the present invention, wherein the light emission element illustrated in FIG. 9 is used as a light source.

It is possible to form a laser device having the light emission layer illustrated in FIG. 9 as a basic structure. FIG. 11 schematically illustrates a device which can output a laser ray by, in the same manner as in method for producing the molecular light emission device illustrated in FIG. 9, depositing a gold thin layer 52 of several nanometer thickness on a flat transparent substrate 51, growing the light emission molecule 53 disclosed in the present invention as a monolayer by Langmuir-Blodgett method, growing gold 54 up to a thickness of several nanometers as an upper electrode, growing chromium 55 up to a thickness of several tens of nanometers, growing aluminum 56 up to a thickness of 1 $\mu$m, put a total reflection mirror 57 at one end of an opening of the device, and put a semi-reflection mirror 58 at the other end. In the present embodiment, the direction along which the laser ray can be taken out is a direction perpendicular to the electrodes. However, by setting the electrodes into a suitable structure, light can also be emitted in the same direction as the electrode direction. The fact that its emitted wavelength is decided by the distance between the total reflection mirror 57 and the semi-reflection mirror 58 is the same as in the case of Fabry-Perot type of conventional laser devices, which will not need to be explained.

Embodiment VI

In the above-mentioned embodiments, the surface sites where molecules are arranged cannot be especially specified. However, depending of use, it is necessary that light emission molecules be deposited on specified sites. The present embodiment discloses a method for deciding the arrangement of the light emission molecules at an atomic level. In order to attain such an object, it is effective that at the start connecting atoms such as gold or silicon are beforehand deposited onto the sites where the molecules should be deposited so that the molecules can be selectively connected to the sites.

Figure 12:
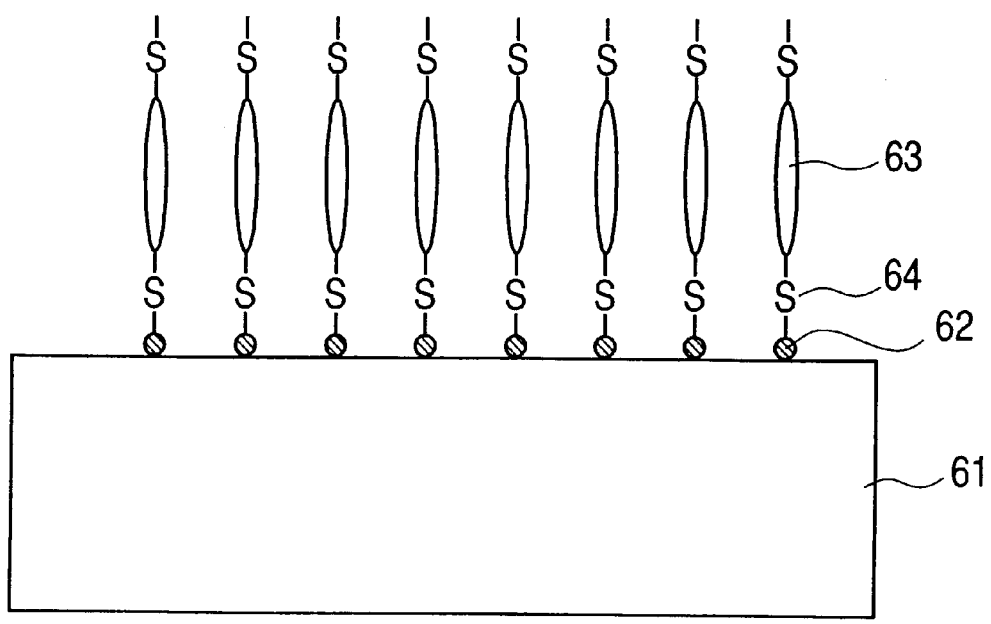
FIG. 12 is a cross section showing a model for arranging light emission molecules in predetermined sites.

FIG. 12 is a schematic view of this manufacturing method, and illustrates a situation wherein gold atoms 62 are selectively arranged on predetermined sites of a substrate 61 by using an STM, and then thiol groups 64 of the light emission molecules 63 are connected to the sites of the gold atoms. Such a structure makes it possible to arrange the light emission molecules on the predetermined sites that are controlled at atomic dimensions.

As described above, by use of this method it is possible to arrange the given light emission molecules selectively on predetermined sites of the substrate surface and realize a molecular light emission laser device 160.

Figure 13:
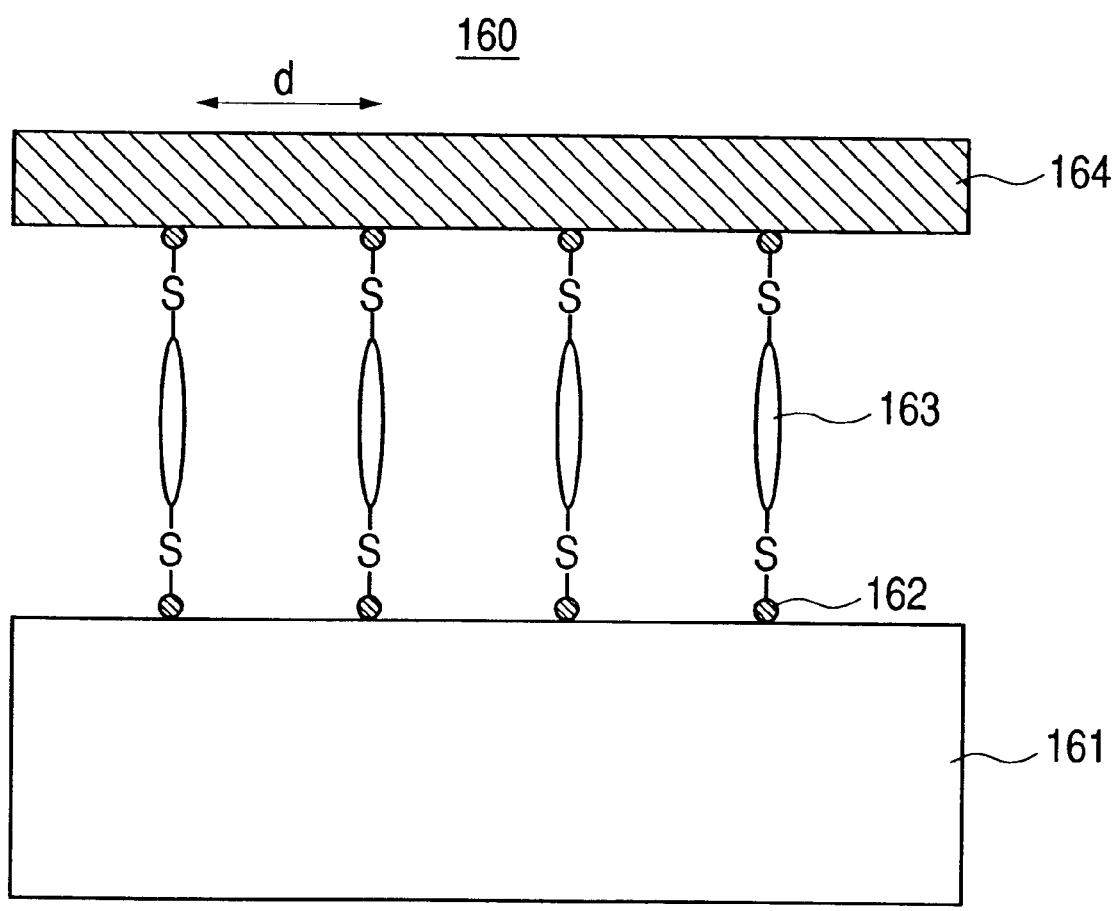
FIG. 13 is a cross section illustrating a laser device according to an embodiment of the present invention, wherein the arrangement of the light emission molecules of the light emission element illustrated in FIG. 9 is controlled.

FIG. 13 is a schematic view of a laser device according to a molecular light emission device and illustrates a situation wherein an arrangement period is set to a half of an emitting wavelength so that gold atoms 162 are arranged on a substrate 161, and then thereon a light emission molecule 163 and an upper electrode 164 are arranged and formed. Such a device structure causes the device to function as the molecular light emission laser device 160. The characteristic of this device is in that it does not need a reflection mirror of Fabry-Perot type that has been so far necessary for conventional devices. As a result, a high efficiency laser emission element can be realized. The technical advantages thereof are very great.

Embodiment VII

FIG. 14 is a cross section which schematically illustrates a part of a more specific structure of a light emission type display 170 wherein the unit-structures shown in FIG. 10 are arranged. Reference numbers 171, 172 and 173 represent a silicon substrate, a layer of silicon dioxide $SiO_2$ deposited on this Si substrate, and a Si layer formed on the upper surface, respectively. Reference number 174 represents silicon nitride SiN, which separates the Si layer to function as partitions for the respective display windows shown in FIG. 10. Furthermore, reference numbers 175 and 176 represent a metal thin layer and silicon nitride SiN, respectively, which function as display windows. A matter which is representatively illustrated by reference number 177 is a light emission molecule the example of which is illustrated by FIG. 5, wherein one end is thiol and the other end is carbonic acid.

In the case that one of the light emission molecule 177 is thiol and the other end is carbonic acid, if the light emission molecule is injected into the space formed by the silicon layer 173 and the metal thin layer 175, the thiol of the light emission molecule 177 is bonded to the metal thin layer 175, which is an electron injection electrode, and the carbonic acid of the light emission molecule 177 is bonded to the silicon Si layer 173, which is a hole injection electrode. For this reason, a given structure of the electron injection electrode/light emission molecule/hole injection electrode is formed.

The following will briefly describe a method for manufacturing the structure illustrated in FIG. 14.

First, silicon dioxide $SiO_2$ layer 172 is deposited on the silicon Si substrate 171. In this state, necessary XY matrix wiring layers are formed on the $SiO_2$ layer 172. Next, a Si layer 173 is formed on the $SiO_2$ layer 172. This Si layer 173 is oxidized so that the portion from the surface to ⅔ of the total thickness is changed into $SiO_2$. Next, XY grooves are then dug through this SiO2 layer and the remaining Si layer 173, correspondingly to the area where the silicon nitride SiN 174 is arranged. These groves are then embedded by silicon nitride SiN. Thereafter, a gold thin layer 175 is vapor-deposited on this upper surface. Next, a silicon nitride SiN layer 176 is formed on the upper surface. openings 178 are made in a part of respective display windows partitioned by the silicon nitride SiN 174, and then the $SiO_2$ layer between the remaining Si layer 173 and the metal thin layer 175 is removed through the openings 178. Instead of the removed layer, the light emission molecule 177 is dissolved into a solvent and injected thereto. At this time, the injection of the solvent is made easier by making another opening corresponding to each of the openings 178 in the respective display windows, which is not illustrated. After the solvent is injected, it is vaporized and removed. In the case that the gold thin layer 175 is used as a common electrode, electrical separation is unnecessary. However, in the case that wiring is applied to this layer 175 for electrical control, electrical separation and wiring through an insulating film are necessary before the silicon nitride layer SiN layer 176 is formed.

As is evident from the above-mentioned embodiments, the present invention makes it possible to realize a single organic molecular light emission device which is far more effective than conventional stack-type organic light mission devices. Thus, thin, light, flexible and highly effective displays can be realized, which exhibits great technical advantages of the present invention.

What is claimed is:

1. An organic molecular light emission device, comprising:
    a substrate;
    an electron injection electrode on the substrate;
    a light emission single molecule layer ohmically connected to the electron injection electrode; and
    a hole injection electrode ohmically connected to the light emission single molecule layer, the electron injection electrode, the light emission single molecule layer, and the hole injection electrode being cascade-connected;
    wherein said light emission single molecule layer includes at least one organic molecule, in which one end of each said organic molecule is connected to at least one atom of the surface of said electron injection electrode by at least one chemical bond, and the other end of each said organic molecule is connected to at least one atom of the surface of said hole injection electrode by at least one chemical bond.

2. An organic molecular light emission device, comprising:
    a substrate;
    an electron injection electrode on the substrate;
    a light emission single molecule layer ohmically connected to the electron injection electrode; and
    a hole injection electrode ohmically connected to the light emission single molecule layer, the electron injection electrode, the light emission single molecule layer, and the hole injection electrode being cascade-connected;
    wherein said light emission single molecule layer includes at least one organic molecule, which consists of an electron transport part, a light emission part and a hole transport part in which one end of each said organic molecule is connected to at least one atom of the surface of said electron injection electrode by at least one chemical bond, and the other end of each said organic molecule is connected to at least one atom of the surface of said hole injection electrode by at least one chemical bond.

3. A display device, comprising:
    a plurality of unit pixels, each unit pixel being an organic molecular light emission device which has a substrate; an electron injection electrode on the substrate; a light emission single molecule layer ohmically connected to the electron injection electrode; and a hole injection electrode ohmically connected to the light emission single molecule layer, the electron injection electrode, the light emission single molecule layer, and the hole injection electrode being cascade-connected, said light emission single molecule layer including at least one organic molecule, in which one end of each said organic molecule is connected to at least one atom of the surface of said electron injection electrode by at least one chemical bond, and the other end of each said organic molecule is connected to at least one atom of the surface of said hole injection electrode by at least one chemical bond, and said plurality of unit pixels being placed in a plane; and
    control means which controls light emission from the individual pixels.

4. A display device according to claim 3, wherein color filters are equipped in each pixel as means for displaying different colors.

5. A display device according to claim 3, wherein each pixel contains a plurality of organic light emitting molecules as means for displaying necessary colors.

6. A LASER device, comprising:
a plurality of periodically-arranged organic molecular light emission devices, each organic molecular light emission device including:
a substrate;
an electron injection electrode on the substrate;
a light emission single molecule layer ohmically connected to the electron injection electrode;
a hole injection electrode ohmically connected to the light emission single molecule layer, the electron injection electrode, the light emission single molecule layer, and the hole injection electrode being cascade-connected; and
a total reflection mirror and a semi-reflection mirror arranged at respective sides of said light emission single molecule layer;
wherein said light emission single molecule layer has at least one organic molecule, in which one end of each said organic molecule is connected to at least one atom of the surface of said electron injection electrode by at least one chemical bond, and the other end of each said organic molecule is connected to at least one atom of the surface of said hole injection electrode by at least one chemical bond, wherein the period is (1/n) of the emitted light wavelength, and wherein n is an integer.

7. A LASER device, comprising:
an organic molecular light emission device, including:
a substrate;
an electron injection electrode on the substrate;
a light emission layer ohmically connected to the electron injection electrode;
a hole injection electrode ohmically connected to the light emission layer;
a total reflection mirror and a semi-reflection mirror arranged at respective sides of said light emission layer; and
light reflecting devices arranged at both sides of a light emission part in which the organic molecule is arranged, thereby performing Fabry-Perot type laser oscillation;
wherein the light emission layer has at least one monolayer of an organic molecule, in which one end of each said organic molecule is connected to at least one atom of the surface of said electron injection electrode by at least one chemical bond, and the other end of each said organic molecule is connected to at least one atom of the surface of said hole injection electrode by at least one chemical bond.

8. An organic molecular light emission device according to claim 1, which contains at least one bond wherein the terminal end of the organic molecule is a substituent containing sulfur, selenium or tellurium, and the electrode atom bonded thereto is gold; or the terminal end of the organic molecule is a carbonic acid, and the electrode atom bonded thereto is silicon.

9. An organic molecular light emission device according to claim 2, which contains at least one bond wherein the terminal end of the organic molecule is a substituent containing sulfur, selenium or tellurium, and the electrode atom bonded thereto is gold; or the terminal end of the organic molecule is a carbonic acid, and the electrode atom bonded thereto is silicon.

10. A display device according to claim 3, which contains at least one bond wherein the terminal end of the organic molecule is a substituent containing sulfur, selenium or tellurium, and the electrode atom bonded thereto is gold; or the terminal end of the organic molecule is a carbonic acid, and the electrode atom bonded thereto is silicon.

11. A LASER device according to claim 6, which contains at least one bond wherein the terminal end of the organic molecule is a substituent containing sulfur, selenium or tellurium, and the electrode atom bonded thereto is gold; or the terminal end of the organic molecule is a carbonic acid, and the electrode atom bonded thereto is silicon.

12. A LASER device according to claim 7, which contains at least one bond wherein the terminal end of the organic molecule is a substituent containing sulfur, selenium or tellurium, and the electrode atom bonded thereto is gold; or the terminal end of the organic molecule is a carbonic acid, and the electrode atom bonded thereto is silicon.

13. A display device, comprising:
a plurality of unit pixels, each unit pixel being an organic molecular light emission device according to claim 2, said plurality of unit pixels being placed in a plane; and
control means which controls light emission from the individual pixels.

14. A display device according to claim 13, wherein color filters are equipped in each pixel as means for displaying different colors.

15. A display device according to claim 13, wherein each pixel contains a plurality of appropriate organic light emitting molecules as means for displaying necessary colors.

16. A display device according to claim 13, which contains at least one bond wherein the terminal end of the organic molecule is a substituent containing sulfur, selenium or tellurium, and the electrode atom bonded thereto is gold; or the terminal end of the organic molecule is a carbonic acid, and the electrode atom bonded thereto is silicon.

* * * * *